(12) United States Patent
Fang et al.

(10) Patent No.: US 12,130,985 B2
(45) Date of Patent: Oct. 29, 2024

(54) DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventors: Liang Fang, Hubei (CN); Ding Ding, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/611,113

(22) PCT Filed: Sep. 29, 2021

(86) PCT No.: PCT/CN2021/121887
§ 371 (c)(1),
(2) Date: Mar. 30, 2023

(87) PCT Pub. No.: WO2023/044951
PCT Pub. Date: Mar. 30, 2023

(65) Prior Publication Data
US 2024/0045544 A1    Feb. 8, 2024

(30) Foreign Application Priority Data
Sep. 26, 2021   (CN) .......................... 202111130707.0

(51) Int. Cl.
G06F 3/041    (2006.01)
H10K 59/40    (2023.01)
G06F 3/044    (2006.01)

(52) U.S. Cl.
CPC .......... *G06F 3/0418* (2013.01); *G06F 3/0412* (2013.01); *H10K 59/40* (2023.02); *G06F 3/044* (2013.01); *G06F 2203/04107* (2013.01)

(58) Field of Classification Search
CPC ...... G06F 3/0418; G06F 3/0412; G06F 3/044; G06F 2203/04107; H10K 59/40
See application file for complete search history.

(56) References Cited

U.S. PATENT DOCUMENTS

| 2017/0153731 A1 | 6/2017 | Liu et al. | |
| 2019/0018519 A1* | 1/2019 | Kim | G06F 3/0448 |
| 2023/0061413 A1* | 3/2023 | Zhang | H10K 59/40 |

FOREIGN PATENT DOCUMENTS

| CN | 107092400 A | 8/2017 |
| CN | 110244873 A | 9/2019 |

(Continued)

OTHER PUBLICATIONS

Zhong et al., CN 210534741 U machine translation, May 15, 2020 (Year: 2020).*

(Continued)

*Primary Examiner* — Peter D McLoone
(74) *Attorney, Agent, or Firm* — PV IP PC; Wei Te Chung (57) ABSTRACT

A display panel is provided. The display panel includes a plurality of functional unit groups arranged in a display area. Each functional unit group includes at least one functional unit. Each functional unit is electrically connected to a first signal transmission line. A signal shielding line is disposed between the first signal transmission lines of a same functional unit group and a functional units of an adjacent functional unit group to solve a problem of poor touch performance caused by signal interference in existing touch solutions.

19 Claims, 5 Drawing Sheets

(56) References Cited

FOREIGN PATENT DOCUMENTS

| CN | 110737354 A | 1/2020 |
| CN | 210534741 U | 5/2020 |
| CN | 112684932 A | 4/2021 |
| CN | 112711347 A | 4/2021 |
| CN | 112711349 A | 4/2021 |
| CN | 113296624 A | 8/2021 |
| CN | 213904304 U | 8/2021 |
| KR | 20080096321 A | 10/2008 |

OTHER PUBLICATIONS

International Search Report in International application No. PCT/CN2021/121887, mailed on Jun. 24, 2022.
Written Opinion of the International Search Authority in International application No. PCT/CN2021/121887, mailed on Jun. 24, 2022.
Chinese Office Action issued in corresponding Chinese Patent Application No. 202111130707.0 dated Apr. 16, 2023, pp. 1-7.

* cited by examiner

DISPLAY PANEL

RELATED APPLICATIONS

This application is a Notional Phase of PCT Patent Application No. PCT/CN2021/121887 having international filing date of Sep. 29, 2021, which claims the benefit of priority of Chinese Patent Application No. 202111130707.0 filed on Sep. 26, 2021. The contents of the above applications are all incorporated by reference as if fully set forth herein in their entirety.

FIELD OF DISCLOSURE

The present disclosure relates to the field of display technologies, and in particular to a display panel.

BACKGROUND

Flexible organic light-emitting diode (OLED) displays have advantages of active light emission, large viewing angles, wide color gamut, high brightness, fast response speeds, low power consumption, and flexible structure, and they are becoming more and more popular in the market. An on-cell touch solution of a flexible active-matrix organic light-emitting diode (AMOLED) display is to disposed a touch panel on the OLED panel. The touch panel may adopt a self-capacitance structure, i.e., a self-capacitance direct on-cell touch (S-DOT) solution. The self-capacitance structure includes a plurality of independent sub-touch electrodes, and each independent sub-touch electrode is independently led out through a touch wire, which can effectively improve performance such as touch sensitivity. However, in the self-capacitive touch solution, there is signal interference between the touch wire and an adjacent sub-touch electrode, which in turn leads to poor touch performance.

SUMMARY OF DISCLOSURE

The present disclosure provides a display panel to solve a technical problem of poor touch performance in existing touch solutions.

In order to solve the above problems, technical solutions provided by the present disclosure are as follows.

An embodiment of the present disclosure provides a display panel, which includes a display area and a non-display area surrounding the display area. The display panel further includes:
 a plurality of functional unit groups disposed in the display area and arranged at intervals along a first direction, wherein each of the functional unit groups includes at least one functional unit arranged along a second direction;
 a plurality of first signal transmission lines, wherein each of the first signal transmission lines is electrically connected to one of the functional units; and
 a signal shielding line correspondingly disposed on a gap between two adjacent functional unit groups, and disposed between the first signal transmission lines of a same functional unit group and a functional unit of an adjacent functional unit group.

In the display panel of the embodiment of the present disclosure, the display panel further includes at least one signal monitoring line correspondingly disposed to the gap between two adjacent functional unit groups.

In the display panel of the embodiment of the present disclosure, a driving signal on the signal shielding line is the same as a driving signal on a corresponding first signal transmission line.

In the display panel of the embodiment of the present disclosure, the driving signal on the signal shielding line is a constant voltage signal.

In the display panel of the embodiment of the present disclosure, the non-display area includes an upper bezel region, a lower bezel region opposite to the upper bezel region, a left bezel region, and a right bezel region. The left bezel region and the right bezel region are connected to the upper bezel region and the lower bezel region. The signal shielding line extends from the display area to the upper bezel region, a plurality of the signal shielding lines close to the left bezel region are connected together in the upper bezel region and extend to the left bezel region, and a plurality of the signal shielding lines close to the right bezel region are connected together in the upper bezel region and extend to the right bezel region.

In the display panel of the embodiment of the present disclosure, the signal monitoring line also extends from the display area to the upper bezel region and extends from the upper bezel region to the left bezel region or the right bezel region, and in the non-display area, the signal monitoring line is disposed on a side of the signal shielding line away from the display area.

In the display panel of the embodiment of the present disclosure, the lower bezel region includes a binding region, the binding region is bound with driver chips, and the first signal transmission lines, the signal shielding line, and the signal monitoring line are all electrically connected to the driver chips. The signal shielding line and the signal monitoring line both extend from the left bezel region or the right bezel region to the lower bezel region, and are electrically connected to the driver chips. The signal shielding line and the signal monitoring line on the left bezel region are electrically connected to one of the driver chips close to the left bezel region, and the signal shielding line and the signal monitoring line on the right bezel region are electrically connected to one of the driver chips close to the right bezel region.

In the display panel of the embodiment of the present disclosure, the functional unit includes a touch sensing unit configured to realize a touch function of the display panel.

In the display panel of the embodiment of the present disclosure, the first signal transmission lines, the signal shielding line, and the signal monitoring line are all formed on a same layer as the functional unit.

In the display panel of the embodiment of the present disclosure, the display panel further includes an insulating protection layer disposed between the functional unit and the first signal transmission lines. Each of the first signal transmission lines is electrically connected to a corresponding functional unit through a first via hole of the insulating protection layer.

In the display panel of the embodiment of the present disclosure, the signal monitoring line is formed on a same layer as the first signal transmission lines or formed on a same layer as the functional unit.

In the display panel of the embodiment of the present disclosure, the signal monitoring line includes a first sub-signal monitoring line and a second sub-signal monitoring line, the second sub-signal monitoring line is electrically connected to the first sub-signal monitoring line through a second via hole of the insulating protection layer, the first sub-signal monitoring line is formed on a same layer as the functional unit, and the second sub-signal monitoring line is formed on a same layer as the first signal transmission lines.

In the display panel of the embodiment of the present disclosure, the signal shielding line includes a first sub-signal shielding line and a second sub-signal shielding line, the second sub-signal shielding line is electrically connected to the first sub-signal shielding line through a third via hole of the insulating protection layer, the first sub-signal shielding line is formed on a same layer as the functional unit, and the second sub-signal shielding line is formed on a same layer as the first signal transmission lines.

The display panel of the present disclosure includes the display area and the non-display area surrounding the display area. The plurality of functional unit groups disposed in the display area and arranged at intervals along the first direction. Each of the functional unit groups includes at least one functional unit arranged along the second direction. Each of the first signal transmission lines is electrically connected to one of the functional units. The signal shielding line is disposed between the first signal transmission lines of the same functional unit group and the functional unit of the adjacent functional unit group. The signal shielding line is correspondingly disposed on a gap between two adjacent functional unit groups. The signal shielding line can shield a signal interference of the functional unit to the first signal transmission lines. Moreover, there is also at least one signal monitoring line corresponding to the gap between two adjacent functional unit groups. The signal monitoring line can monitor the interference signal in real time, and the interference signal is removed through a chip algorithm. The problem of poor touch performance caused by the signal interference is improved, thereby solving the problem of poor touch performance in existing touch solutions.

BRIEF DESCRIPTION OF DRAWINGS

In order to explain technical solutions of embodiments or the prior art more clearly, the following will briefly introduce drawings that need to be used in the description of the embodiments or the prior art. Apparently, the drawings in the following description are only some embodiments of the present disclosure. For those of ordinary skill in the art, other drawings can be obtained based on these drawings without creative efforts.

DETAILED DESCRIPTION

The description of the following embodiments refers to the accompanying drawings to illustrate specific embodiments that the present disclosure can be implemented. Directional terms described by the present disclosure, such as upper, lower, front, back, left, right, inner, outer, side and etc., are only directions by referring to the accompanying drawings. Thus, the used directional terms are used to describe and understand the present disclosure, but the present disclosure is not limited thereto. In the drawings, units with similar structures are indicated by the same reference numerals. In the drawings, for clear understanding and ease of description, thicknesses and regions of some layers are exaggerated. That is, a size and a thickness of each component shown in the drawings are arbitrarily shown, and the present disclosure is not limited thereto.

Figure 1:
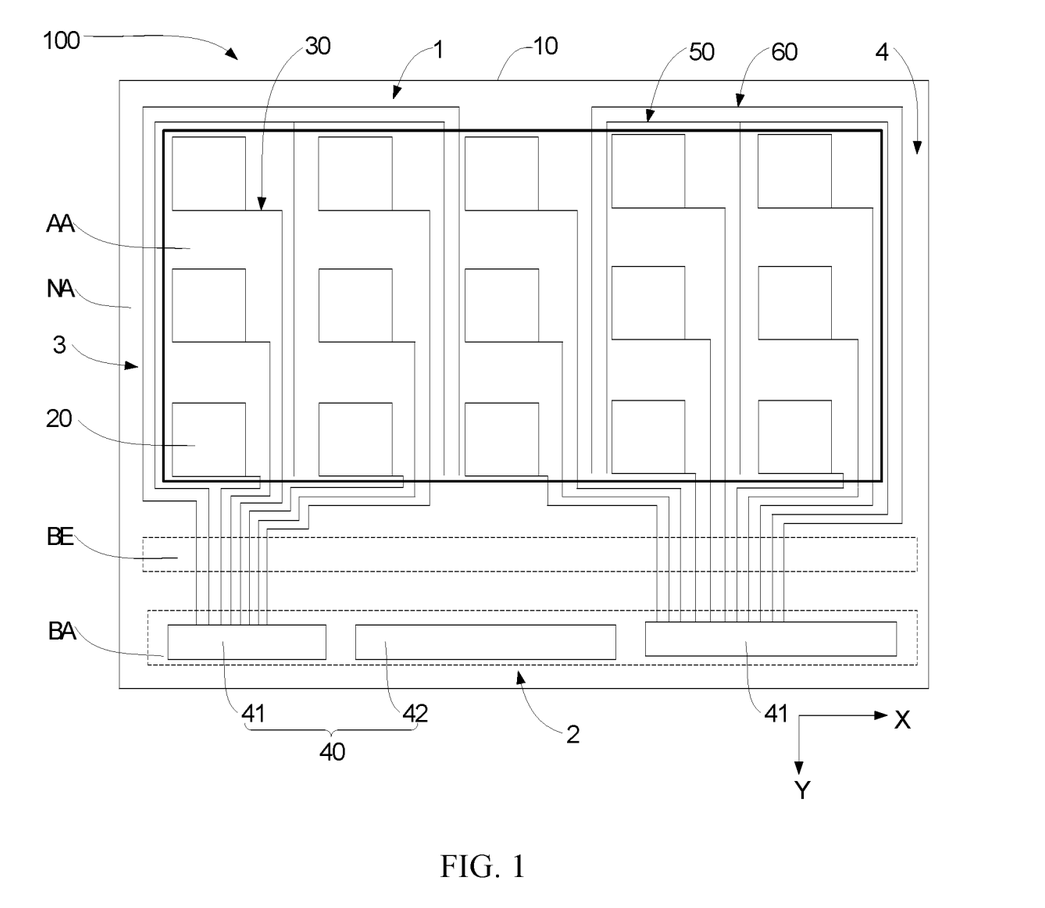
FIG. 1 is a top view of a display panel of an embodiment of the present disclosure.
Figure 2:
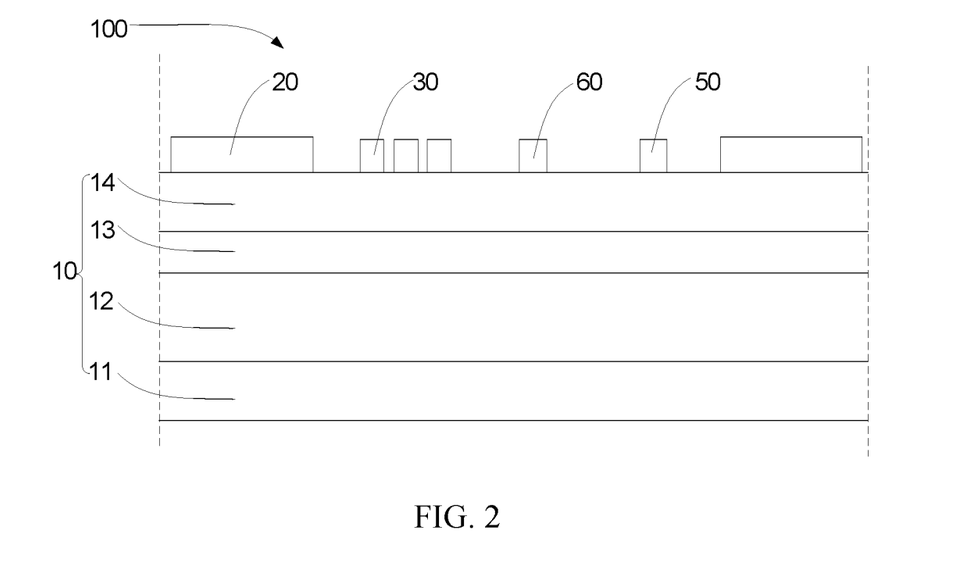
FIG. 2 is a cross-sectional view of the display panel of the embodiment of the present disclosure.
Figure 3:
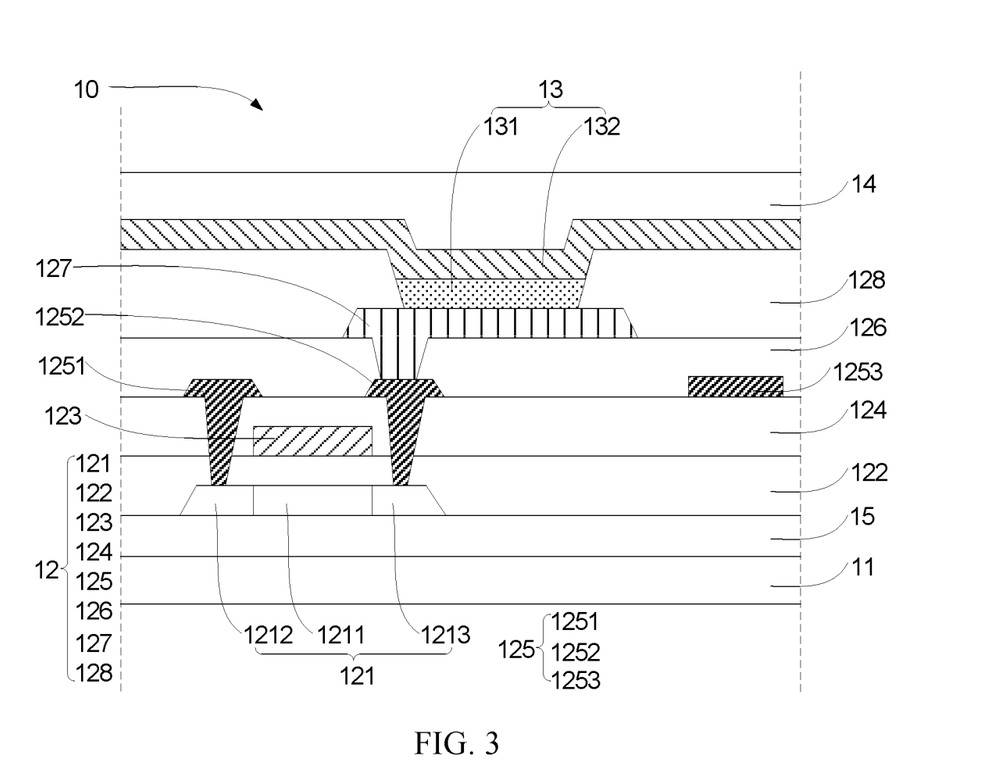
FIG. 3 is a schematic diagram of a detailed structure of a display assembly in FIG. 2.

Referring to FIG. 1 to FIG. 3, FIG. 1 is a top view of a display panel of an embodiment of the present disclosure, FIG. 2 is a cross-sectional view of the display panel of the embodiment of the present disclosure, and FIG. 3 is a schematic diagram of a detailed structure of a display assembly in FIG. 2. A display panel 100 includes a display area AA and a non-display area NA surrounding the display area AA. The display panel 100 also includes a display assembly 10 and a plurality of functional unit groups disposed on the display assembly 10. The plurality of the functional unit groups are disposed in the display area AA and arranged at intervals along a first direction X. Each functional unit group includes at least one functional unit 20 arranged along a second direction Y. The first direction X is a horizontal direction, and the second direction Y is a vertical direction. The first direction X and the second direction Y have an included angle of 90 degrees, and the present disclosure is not limited thereto. The first direction X and the second direction Y of the present disclosure can also be set at other angles.

Specifically, the functional units 20 are disposed on the display assembly 10 in an array. The display assembly 10 is configured to implement a display function of the display panel 100, and the functional unit 20 is configured to implement a fingerprint recognition, a touch control, and other functions. For example, when it is used to implement a fingerprint recognition function, the functional unit 20 is a fingerprint sensor. When it is used to implement a touch function, the functional unit 20 is a touch sensing unit. In the present disclosure, taking the functional unit 20 being the touch sensing unit as an example, a touch solution of a direct on-cell touch (DOT, the touch function is directly formed on the display unit) is employed to directly form the functional unit 20 on the display assembly 10, such that the display panel 100 has better integration, transmittance, and bending performance, and can effectively reduce a thickness of a screen and reduce product cost.

Specifically, the display assembly 10 includes a substrate 11 and a driving circuit layer 12, a light-emitting functional layer 13, and an encapsulation layer 14 which are stacked on the substrate 11 in sequence. The functional unit 20 is directly formed on the encapsulation layer 14.

Alternatively, the substrate 11 may be a rigid substrate or a flexible substrate. If the substrate 11 is the rigid substrate, it may include a rigid substrate such as a glass substrate. If the substrate 11 is the flexible substrate, it may include a polyimide (PI) film, an ultra-thin glass film, and other flexible substrates. Using the flexible substrate as the substrate 11 can form a flexible display panel to achieve special properties such as bending and curling of the display panel 100.

Alternatively, a buffer layer 15 may be further disposed between the substrate 11 and the driving circuit layer 12. Material of the buffer layer 15 may include inorganic materials such as silicon oxide (SiOx), silicon nitride (SiNx), and silicon oxynitride (SiON). The buffer layer 15 can further prevent undesirable impurities or contaminants (such as moisture, oxygen, etc.) from diffusing from the substrate 11 into devices that may be damaged by these impurities or contaminants. It can also provide a flat top surface.

The driving circuit layer 12 includes an active layer 121, a gate insulating layer 122, a gate 123, an interlayer insulating layer 124, a source and drain layer 125, a planarization layer 126, a pixel electrode 127, and a pixel definition layer 128 which are stacked on the buffer layer 15 in sequence. The active layer 121 includes a channel region 1211 and a source region 1212 and a drain region 1213 which are disposed on both sides of the channel region 1211. The gate insulating layer 122 covers the active layer 121 and the buffer layer 15. The gate 123 is disposed on the gate insulating layer 122, and the gate 123 is disposed correspondingly to the channel region 1211.

The interlayer insulating layer 124 covers the gate 123 and the gate insulating layer 122. The source and drain layer 125 is disposed on the interlayer insulating layer 124. The source and drain layer 125 is patterned to form a source 1251, a drain 1252, a data line 1253, and the like. The source 1251 is connected to the source region 1212 through a via hole of the interlayer insulating layer 124. The drain 1252 is connected to the drain region 1213 through another via hole of the interlayer insulating layer 124.

The planarization layer 126 covers the source and drain layer 125 and the interlayer insulating layer 124. The planarization layer 126 can provide a flat film surface for the display panel 100 to improve stability of formation of the light-emitting functional layer 13. The pixel electrode 127 is disposed on the planarization layer 126, and is connected to the source 1251 or the drain 1252 through the via hole of the planarization layer 126. The present disclosure takes the connection of the pixel electrode 127 and the drain 1252 as an example.

The pixel definition layer 128 covers the pixel electrode 127 and the planarization layer 126, and the pixel definition layer 128 is patterned to form a pixel opening. The pixel opening exposes a portion of the pixel electrode 127 to define a light-emitting area.

It should be noted that a structure of the driving circuit layer 12 of the present disclosure is not limited to that illustrated in this embodiment. The driving circuit layer 12 of the present disclosure may also include more or fewer film layers, and positional relationship of each film layer is not limited to that illustrated in this embodiment. For example, the gate 123 may also be disposed under the active layer 121 to form a bottom gate structure. The driving circuit layer 12 is configured to provide a driving voltage to the light-emitting functional layer 13 to make the light-emitting functional layer 13 emit light.

The light-emitting functional layer 13 includes light-emitting units 131 and cathodes 132. In the light-emitting units 131, luminescent materials of different colors are arranged on an entire surface of the driving circuit layer 12, and the formed luminescent materials of different colors can emit light of different colors. For example, a red luminescent material emits red light, a green luminescent material emits green light, and a blue luminescent material emits blue light.

The cathode 132 covers the light-emitting unit 131. The light-emitting unit 131 emits light under a cooperation of the pixel electrode 127 and the cathode 132. The light-emitting units 131 of different colors emit light of different colors, thereby realizing full-color display of the display panel 100.

Alternatively, the pixel electrode 127 may be a transparent electrode or a reflective electrode. If the pixel electrode 127 is the transparent electrode, the pixel electrode 127 may be made of, for example, indium tin oxide (ITO), indium zinc oxide (IZO), ZnO, or $In_2O_3$. If the pixel electrode 127 is the reflective electrode, the pixel electrode 127 may include, for example, a reflective layer made of Ag, Mg, Al, Pt, Pd, Au, Ni, Nd, Ir, Cr, or a combination thereof and a layer made of ITO, IZO, ZnO, or $In_2O_3$. However, the pixel electrode 127 is not limited thereto, and the pixel electrode 127 may be made of various materials, and may also be formed as a single-layer or multi-layer structure.

It should be noted that whether the pixel electrode 127 is the transparent electrode or the reflective electrode depends on a light-emitting direction of the display panel 100. If the display panel 100 adopts a top light emission, the pixel electrode 127 may be the transparent electrode or the reflective electrode. Apparently, utilization of light emitted by the light-emitting unit 131 can be improved when the reflective electrode is adopted. If the display panel 100 adopts a bottom light emission, the pixel electrode 127 adopts the transparent electrode to increase light transmittance. In this embodiment, the display panel 100 adopts the top light emission as an example. In order to increase the light transmittance, the cathode 132 needs to be made of a transparent conductive material. For example, the cathode 132 may be made of a transparent conductive oxide (TCO) such as ITO, IZO, ZnO, or $In_2O_3$.

Alternatively, the light-emitting functional layer 13 may further include a hole injection layer (HIL), a hole transport layer (HTL), an electron injection layer (EIL), and an electron transport layer (ETL). The hole injection layer and the hole transport layer are disposed between the light-emitting unit 131 and the pixel electrode 127. The electron injection layer and the electron transport layer are disposed between the light-emitting unit 131 and the cathode 132. The hole injection layer receives holes transmitted by the pixel electrode 127. The holes are transported to the light-emitting unit 131 through the hole transport layer. The electron injection layer receives electrons transmitted from the cathode 132. The electrons are transported to the light-emitting unit 131 through the electron transport layer. The holes and the electrons combine at the light-emitting unit 131 to generate excitons. The excitons transition from an excited state to a ground state to release energy and emit light.

The encapsulation layer 14 covers the light-emitting functional layer 13 and is configured to protect the light-emitting unit 131 of the light-emitting functional layer 13 to prevent water and oxygen from permeating and causing the light-emitting unit 131 to fail. Alternatively, the encapsulation layer 14 may be a thin film encapsulated. For example, the encapsulation layer 14 may be a stacked structure formed by sequentially stacking three layers of a first inorganic encapsulation layer, an organic encapsulation layer, and a second inorganic encapsulation layer or a stacked structure of more layers.

Figure 4:
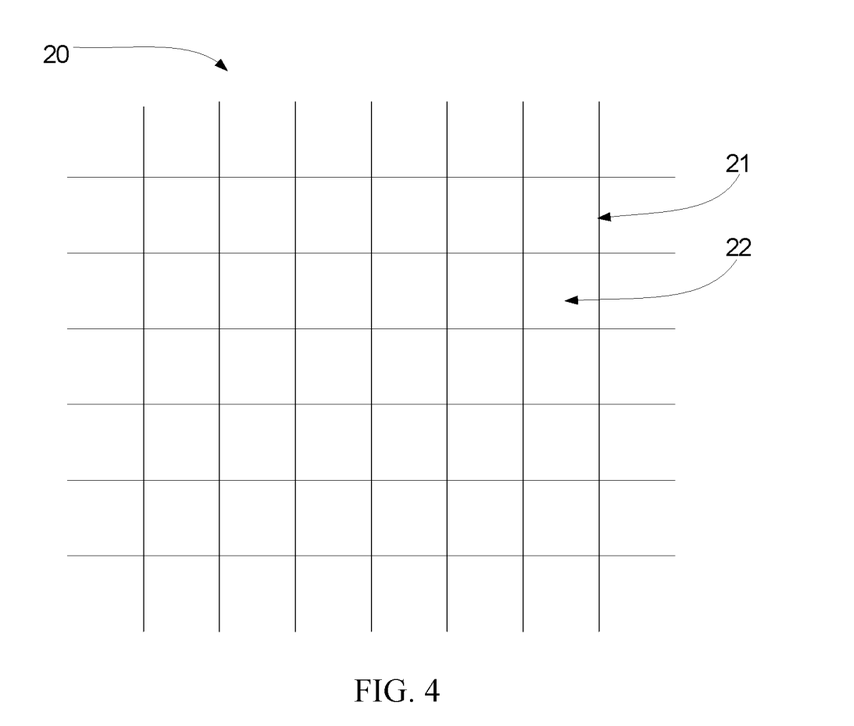
FIG. 4 is a top view of a functional unit of the embodiment of the present disclosure.

The functional units 20 are directly formed on the encapsulation layer 14. The functional unit 20 are disposed on the encapsulation layer 14 in an array. The functional units 20 in each column serves as a functional unit group. The plurality of functional unit groups are arranged at intervals along the first direction X. Each functional unit group in a column includes at least one functional unit 20 arranged along the second direction Y. Each functional unit 20 includes a plurality of touch electrode traces 21 which are intersecting each other. The plurality of touch electrode traces 21 arranged crosswise makes the functional units 20 mesh-shaped. As shown in FIG. 4, FIG. 4 is a top view of a functional unit of the embodiment of the present disclosure. A mesh 22 refers to an open area surrounded by the touch electrode traces 21. The mesh 22 is arranged corresponding to the light-emitting unit 131 of the display assembly 10 to prevent the functional unit 20 from affecting the light emitted by the light-emitting unit 131.

The following will take the display panel 100 including five columns of functional unit groups, and each functional unit group in a column including three functional units 20 as an example to illustrate a touch function structure of the display panel 100:

The five columns of functional unit groups are arranged at intervals along the first direction X. The three functional units 20 of the functional unit group in each column are arranged at intervals along the second direction Y. The display panel 100 also includes a plurality of first signal transmission lines 30. Each of the first signal transmission lines 30 is electrically connected to one of the functional units 20. The first signal transmission lines 30 and the functional units 20 are arranged on a same layer. It should be noted that the "same layer arrangement" in the present disclosure means that in a preparation process, a film layer made of a same material is patterned to obtain at least two different features, and the at least two different features are arranged on a same layer. For example, if the functional units 20 and the first signal transmission lines 30 of this embodiment are obtained by patterning a same conductive film layer, so the functional units 20 and the first signal transmission lines 30 are arranged on a same layer.

The first signal transmission lines 30 of the functional unit group in a same column are led out from a corresponding functional unit 20 along the first direction X, and they extend toward the second direction Y and are disposed in a gap between the functional unit group and the adjacent functional unit group. It can be understood that the first signal transmission lines 30 may also be led out from the functional units 20 in a direction opposite to the first direction X and extend toward the second direction Y. For a column of the functional unit group close to the non-display area NA, the first signal transmission lines 30 corresponding to the functional units 20 can be disposed close to the non-display area NA.

The non-display area NA includes a plurality of bezel regions, such as an upper bezel region 1, a lower bezel region 2, a left bezel region 3, and a right bezel region 4 as schematically shown in FIG. 1. A binding region BA is disposed on one side of the display area AA. Apparently, the lower bezel region 2 is also provided with a bending area BE. The bending area BE is disposed between the display area AA and the binding region BA. By setting the bending area BE, the lower bezel region 2 can be bent to a side of the display assembly 10 away from the functional units 20 to achieve a narrow-bezel or no bezel design. The binding region BA is bound with a driver chip 40. The driver chip 40 includes a touch driver chip 41 and a display driver chip 42. The touch driver chip 41 is connected to the first signal transmission lines 30 and the like, and is configured to provide touch driving signals. The display driver chip 42 is connected to the data line 1253 and the like, and is configured to provide display driving signals. Apparently, the driver chip 40 of the present disclosure can also use a touch display driver integrated (TDDI) chip. The TDDI chip refers to that the touch driver chip 41 and the display driver chip 42 are integrated together, and the two share a chip, so that cost of the chip can be reduced.

It should be noted that if the present disclosure does not specify a type of the driver chip 40, the driver chip 40 of the present disclosure is all interpreted as the touch driver chip 41. The driver chip 40 is electrically connected to the first signal transmission lines 30, and is configured to transmit a driving signal to the first signal transmission lines 30. The driver chip 40 provides driving voltages to the corresponding functional units 20 through the first signal transmission lines 30, and then the first signal transmission lines 30 transmit induction signals of the functional units 20 back to the driver chip 40. During this period, if the functional units 20 are touched by, for example, a finger, a stylus, etc., sensing signals will change to determine a touch position.

When the driver chip 40 provides the driving signals to the functional units 20, a row scanning or column scanning mode is usually used. The functional units 20 in a same column or a same row are provided with a same driving signal, and the functional units 20 in other columns or other rows are provided with a different driving signal, such as grounding, a voltage signal of different frequency, and so on. The present disclosure uses column scanning as an example. The functional units 20 in different columns have different driving signals. In this way, the first signal transmission lines 30 of the functional unit group in a same column and the functional units 20 of an adjacent column have different driving signals.

In order to prevent interference to the first signal transmission lines 30 due to different driving signals of the functional unit groups in two adjacent columns, the display panel 100 of the present disclosure further includes signal shielding lines 50. The signal shielding line 50 is disposed corresponding to a gap between two adjacent functional unit groups, and the signal shielding line 50 is also disposed between the first signal transmission lines 30 of a same functional unit group and the functional units 20 of an adjacent functional unit group. The signal shielding lines 50 and the first signal transmission lines 30 are arranged on a same layer. The signal shielding lines 50 are also electrically connected to the driver chip 40. The driver chip 40 provides driving signals to the signal shielding lines 50.

Alternatively, the driving signal on the signal shielding line 50 is same as the driving signal on a corresponding first signal transmission line 30. Thus, there is no potential difference between the signal shielding line 50 and the corresponding first signal transmission line 30. It will not cause interference to the first signal transmission line 30, and can also shield the interference of the functional units 20 in an adjacent column to the first signal transmission lines 30, thereby improving the touch performance of the display panel 100. Apparently, the driving signal on the signal shielding line 50 of the present disclosure may also be different from the driving signal on the corresponding first signal transmission line 30. For example, the driving signal on the signal shielding line 50 is a constant voltage signal. The interference of the constant voltage signal on the signal shielding line 50 to the first signal transmission line 30 is removed by a chip algorithm of the driver chip 40.

The signal shielding lines 50 extend from the driver chip 40 through the non-display area NA on another side of the display area AA to the display area AA. Specifically, the signal shielding lines 50 can be divided into two groups. The signal shielding line 50 of a first group is led out from the driver chip 40 close to the left bezel region 3, and sequentially passes through the lower bezel region 2, the left bezel region 3, and the upper bezel region 1 of the non-display area NA to enter the display area AA, and it extends toward the second direction Y in the display area AA. A second group of the signal shielding line 50 is led out from the driver chip 40 close to the right bezel region 4, and passes through the lower bezel region 2, the right bezel region 4, and the upper bezel region 1 of the non-display area NA to enter the display area AA, and it extends toward the second direction Y and is disposed in the gap between two adjacent functional unit groups in the display area AA. Apparently, the signal shielding lines 50 of the present disclosure can also be set as one group. A one group of the signal shielding lines 50 are led out from the left bezel region 3 or the right bezel region 4 of the non-display area NA, and extend to the entire display area AA.

Specifically, in order to achieve a good shielding effect, the signal shielding line 50 is disposed between every two adjacent functional unit groups. The signal shielding lines 50 extends from the display area AA to the upper bezel region 1, and converge at one or two places in the upper bezel region 1. When converging at two places, the signal shielding line 50 in one place extends from the upper bezel region 1 to the left bezel region 3. The signal shielding line 50 at another place extends from the upper bezel region 1 to the right bezel region 4, and is connected to the corresponding driver chip 40.

Furthermore, the display panel 100 of the present disclosure also includes at least one signal monitoring line 60. The signal monitoring line 60 is disposed corresponding to the gap between two adjacent functional unit groups. The signal monitoring line 60 is also disposed on a same layer as the first signal transmission lines 30. The signal monitoring line 60 is also electrically connected to the driver chip 40. The driver chip 40 provides a monitoring signal to the signal monitoring line 60, so that the signal shielding line 50 can detect in real time the interference from the display signal (e.g., the data line 1253, etc.) in a vertical direction. According to the interference signal detected by the signal monitoring line 60, the driver chip 40 removes this part of the interference through a chip algorithm, thereby further improving the touch performance of the display panel 100.

The signal monitoring line 60 extends from the driver chip 40 through the non-display area NA on another side of the display area AA to the display area AA. Specifically, a number of signal monitoring lines 60 may be set to two. A first signal monitoring line 60 is led out from the driver chip 40, and passes through the lower bezel region 2, the left bezel region 3, and the upper bezel region 1 of the non-display area NA to enter the display area AA, and it extends toward the second direction Y in the display area AA. A second signal monitoring line 60 is led out from the driver chip 40, and sequentially passes through the lower bezel region 2, the right bezel region 4, and the upper bezel region 1 of the non-display area NA to enter the display area AA, and it extends toward the second direction Y and is disposed in the gap between adjacent functional unit groups of the display area AA. It can be understood that the more the number of the signal monitoring lines 60 are set, the more accurate the interference signal data obtained. Furthermore, in the non-display area NA, the signal monitoring line 60 is disposed on a side of the signal shielding line 50 away from the display area AA. In the display area AA, the signal monitoring line 60 is disposed close to a middle area of the display area AA. Specifically, the two signal monitoring lines 60 are respectively disposed on opposite sides of a same functional unit group, and between a same functional unit group and an adjacent signal shielding line 50. Thus, it is prevented the signal monitoring line 60 and the signal shielding line 50 from crossing, and the signal monitoring line 60 half-encloses a corresponding signal shielding line 50.

In addition, it should be noted that the present disclosure is not limited to being used in DOT touch solutions by setting the signal shielding line 50 and the signal monitoring line 60 to improve the poor touch performance caused by signal interference. For example, it can also be used in an out-cell touch solution. The out-cell touch solution refers to arranging the functional units 20 on the touch panel, and then attaching the touch panel to the display assembly 10.

Figure 5:
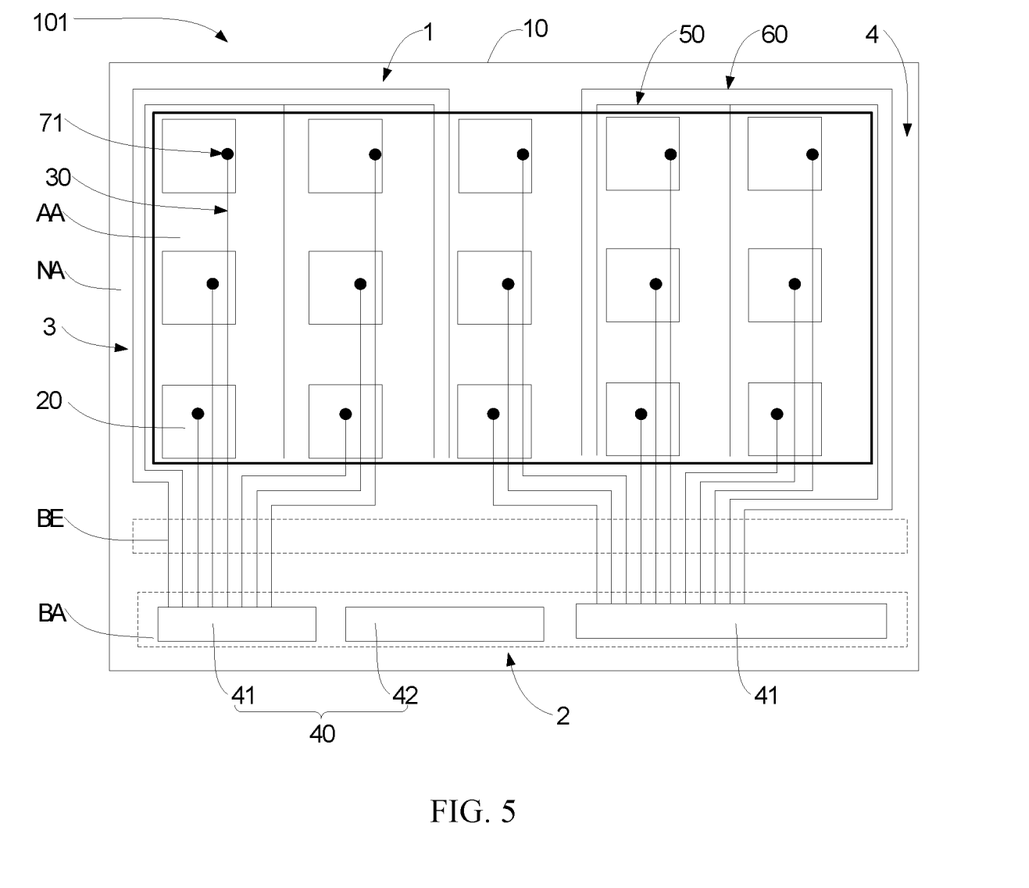
FIG. 5 is another top view of a display panel of the embodiment of the present disclosure.
Figure 6:
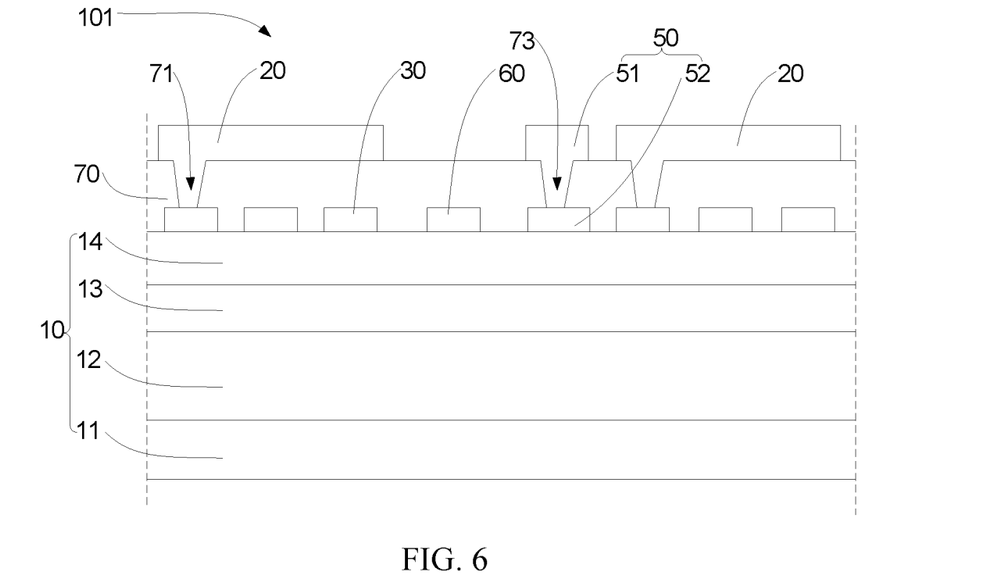
FIG. 6 is another cross-sectional view of the display panel of the embodiment of the present disclosure.

In one embodiment, refer to FIG. 5 and FIG. 6. FIG. 5 is another top view of a display panel of the embodiment of the present disclosure. FIG. 6 is another cross-sectional view of the display panel of the embodiment of the present disclosure. A difference from the foregoing embodiment is that an insulating protection layer 70 is disposed between the functional units 20 of the display panel 101 and the first signal transmission lines 30. The first signal transmission lines 30 are electrically connected to the corresponding functional units 20 through first via holes 71 of the insulating protection layer 70. Specifically, the first signal transmission lines 30 are arranged on the encapsulation layer 14 of the display assembly 10. The insulating protection layer 70 covers the first signal transmission lines 30 and the encapsulation layer 14. The functional units 20 are disposed on the insulating protection layer 70, and are connected to corresponding first signal transmission lines 30 through the first via holes 71 of the insulating protection layer 70.

Alternatively, material of the insulating protection layer 70 includes inorganic materials such as silicon oxide and silicon nitride. The insulating protection layer 70 can protect the first signal transmission lines 30 and prevent short circuits between adjacent first signal transmission lines 30. The first signal transmission lines 30 are electrically connected to the corresponding functional units 20 through the first via holes 71. A number of the first via hole 71 is at least one. Apparently, arranging a plurality of the first via holes 71 to connect the first signal transmission lines 30 to the corresponding functional units 20 can improve stability of connection and reduce impedance.

Furthermore, the first signal transmission lines 30 are arranged corresponding to the functional units 20. An orthographic projection of the first signal transmission lines 30 on the display assembly 10 is within a range of an orthographic projection of the functional units 20 on the display assembly 10. Specifically, the first signal transmission lines 30 are arranged corresponding to the touch electrode traces 21 of the functional units 20 to avoid the meshes 22 of the functional units 20 and prevent the first signal transmission lines 30 from affecting light emission of light emitting units 131.

Furthermore, the signal monitoring line 60 and the first signal transmission lines 30 are arranged on a same layer, and correspond to the gap between the functional unit groups in two adjacent columns. Thus, an orthographic projection of the signal monitoring line 60 on the display assembly 10 and the orthographic projection of the functional units 20 on the display assembly 10 do not overlap. In this way, the signal monitoring line 60 can be close to the display assembly 10 to better monitor the interference from the display signal in the display assembly 10 in real time. At the same time, the signal monitoring line 60 can be kept at a certain distance from the first signal transmission lines 30 to prevent the signal monitoring line 60 from interfering with the first signal transmission lines 30. Apparently, the signal monitoring line 60 can also be arranged on a same layer as the functional units 20, which can also realize real-time monitoring of interference from the display signal in the display assembly 10.

Furthermore, the signal shielding line 50 includes a first sub-signal shielding line 51 and a second sub-signal shielding line 52. The second sub-signal shielding line 52 is electrically connected to the first sub-signal shielding line 51 through a third via hole 73 of the insulating protection layer 70. The first sub-signal shielding line 51 and the functional units 20 are arranged on a same layer. The second sub-signal shielding line 52 and the first signal transmission lines 30 are arranged on the same layer. Alternatively, in the display area AA, the first sub-signal shielding line 51 and the second sub-signal shielding line 52 have same lengths. The first sub-signal shielding line 51 and the second sub-signal shielding line 52 are connected through the third via hole 73. A number of the third via hole 73 is at least one. Thus, the signal shielding line 50 adopts an upper and lower two-layer design, which can better shield the signal interference on the left and right sides. Moreover, the double-layer design is equivalent to increasing a thickness of the signal shielding line 50, which can better block influence of the potential difference. Also, the double-layer design can reduce a trace impedance to reduce a signal attenuation inside the signal shielding line 50 and ensure the shielding effect. For other descriptions, please refer to the above-mentioned embodiments, which will not be repeated here.

Figure 7:
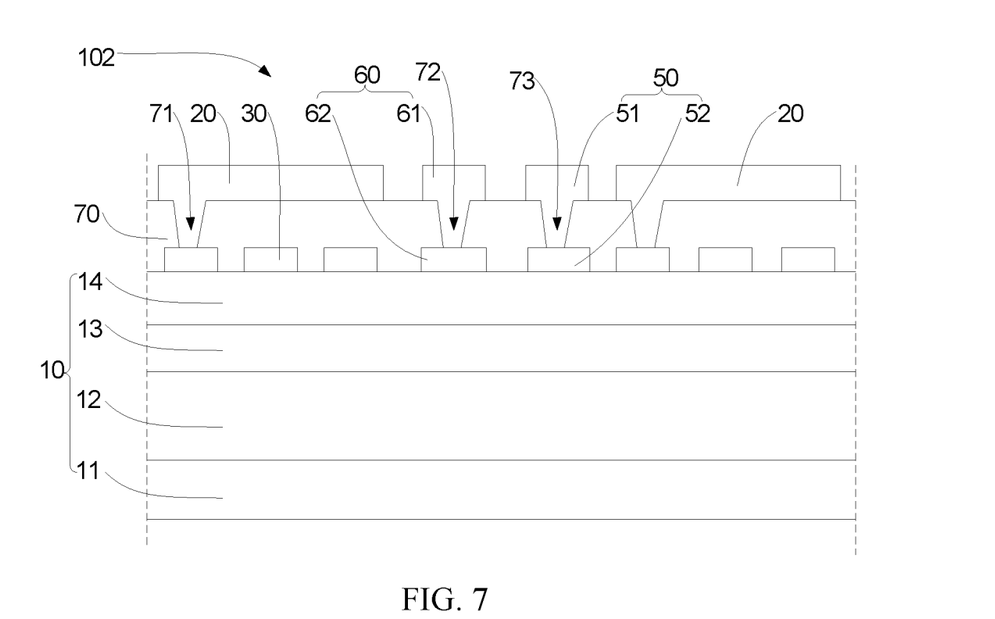
FIG. 7 is another cross-sectional view of a display panel of an embodiment of the present disclosure.

In one embodiment, refer to FIG. 7, FIG. 7 is another cross-sectional view of a display panel of an embodiment of the present disclosure. A difference from the foregoing embodiments is that the signal monitoring line 60 of the display panel 102 also adopts a double-layer design. Specifically, the signal monitoring line 60 includes a first sub-signal monitoring line 61 and a second sub-signal monitoring line 62. The second sub-signal monitoring line 62 is electrically connected to the first sub-signal monitoring line 61 through a second via hole 72 of the insulating protection layer 70. The first sub-signal monitoring line 61 and the functional units 20 are disposed at a same layer. The second sub-signal monitoring line 62 and the first signal transmission lines 30 are disposed on a same layer. For other descriptions, please refer to the above-mentioned embodiments, which will not be repeated here.

In addition, it should be noted that in the present disclosure, the solution for improving the poor touch performance caused by signal interference by setting the signal shielding line 50 and the signal monitoring line 60 is not limited to use in the self-capacitive touch solution in the above embodiments. It can also be used in a single-layer mutual-capacitive touch solution, which will not be repeated here.

According to the above embodiments, it can be known as follows.

The present disclosure provides the display panel. The display panel includes the display area and the non-display area surrounding the display area. The plurality of functional unit groups disposed in the display area and arranged at intervals along the first direction. Each of the functional unit groups includes at least one functional unit arranged along the second direction. Each of the functional units is electrically connected to one of the first signal transmission lines. The signal shielding line is disposed between the first signal transmission lines of a same functional unit group and the functional unit of the adjacent functional unit group. The signal shielding line is correspondingly disposed on a gap between two adjacent functional unit groups. The signal shielding line can shield a signal interference of the functional unit to the first signal transmission lines. Moreover, there is also at least one signal monitoring line corresponding to a gap between two adjacent functional unit groups. The signal monitoring line can monitor the interference signal in real time, and the interference signal is removed through a chip algorithm. The problem of poor touch performance caused by the signal interference is improved, thereby solving the problem of poor touch performance in existing touch solutions.

In the foregoing embodiments, the description of each embodiment has its own focus. For a part that is not described in detail in some embodiment, reference may be made to related descriptions of other embodiments.

The embodiments of the present disclosure are described in detail above. In this specification, specific examples are used to illustrate the principle and implementations of the present disclosure. The description of the above embodiments is only used to help understand the technical solutions of the present disclosure and its core idea. Those of ordinary skill in the art should understand that they can still modify the technical solutions described in the foregoing embodiments, or equivalently replace some of the technical features. These modifications or replacements do not cause the essence of the corresponding technical solutions to deviate from the scope of the technical solutions of the embodiments of the present disclosure.

What is claimed is:

1. A display panel, comprising: a display area and a non-display area surrounding the display area, wherein the display panel further comprises:
   a plurality of functional unit groups disposed in the display area and arranged at intervals along a first direction, wherein each of the functional unit groups comprises at least one functional unit arranged along a second direction;
   a plurality of first signal transmission lines, wherein each of the first signal transmission lines is electrically connected to one of the functional units;
   a signal shielding line correspondingly disposed on a gap between two adjacent functional unit groups and disposed between the first signal transmission lines of a same functional unit group and a functional unit of an adjacent functional unit group; and
   at least one signal monitoring line correspondingly disposed to the gap between two adjacent functional unit groups.

2. The display panel according to claim 1, wherein a driving signal on the signal shielding line is the same as a driving signal on a corresponding first signal transmission line.

3. The display panel according to claim 1, wherein the driving signal on the signal shielding line is a constant voltage signal.

4. The display panel according to claim 1, wherein the non-display area comprises an upper bezel region, a lower bezel region opposite to the upper bezel region, a left bezel region, and a right bezel region, wherein the left bezel region and the right bezel region are connected to the upper bezel region and the lower bezel region;
   the signal shielding line extends from the display area to the upper bezel region, a plurality of the signal shielding lines close to the left bezel region are connected together in the upper bezel region and extend to the left bezel region, and a plurality of the signal shielding lines close to the right bezel region are connected together in the upper bezel region and extend to the right bezel region.

5. The display panel according to claim 4, wherein the signal monitoring line also extends from the display area to the upper bezel region and extends from the upper bezel region to the left bezel region or the right bezel region, and in the non-display area, the signal monitoring line is disposed on a side of the signal shielding line away from the display area.

6. The display panel according to claim 5, wherein the signal shielding lines are disposed between every two adjacent functional unit groups, and the signal shielding lines converge in the upper bezel region and extend toward the left bezel region or the right bezel region.

7. The display panel according to claim 6, wherein a number of the signal monitoring lines is two, and the two signal monitoring lines are respectively disposed on opposite sides of a same functional unit group, and between the same functional unit group and an adjacent signal shielding line.

8. The display panel according to claim 7, wherein the lower bezel region comprises a binding region, the binding region is bound with driver chips, and the first signal transmission lines, the signal shielding line, and the signal monitoring line are all electrically connected to the driver chips;
wherein the signal shielding line and the signal monitoring line both extend from the left bezel region or the right bezel region to the lower bezel region, and are electrically connected to the driver chips; and
the signal shielding line and the signal monitoring line on the left bezel region are electrically connected to one of the driver chips close to the left bezel region, and the signal shielding line and the signal monitoring line on the right bezel region are electrically connected to one of the driver chips close to the right bezel region.

9. The display panel according to claim 1, wherein the functional unit comprises a touch sensing unit configured to realize a touch function of the display panel.

10. The display panel according to claim 1, wherein the first signal transmission lines, the signal shielding line, and the signal monitoring line are all formed on a same layer as the functional unit.

11. The display panel according to claim 1, further comprising an insulating protection layer disposed between the functional unit and the first signal transmission lines, wherein each of the first signal transmission lines is electrically connected to a corresponding functional unit through a first via hole of the insulating protection layer.

12. The display panel according to claim 11, wherein the functional unit comprises a plurality of touch electrode traces, the plurality of the touch electrode traces are surrounded to form a plurality of open areas, and the first signal transmission lines are arranged corresponding to the touch electrode traces.

13. The display panel according to claim 11, wherein the signal monitoring line is formed on a same layer as the first signal transmission lines or formed on a same layer as the functional unit.

14. The display panel according to claim 11, wherein the signal monitoring line comprises a first sub-signal monitoring line and a second sub-signal monitoring line, the second sub-signal monitoring line is electrically connected to the first sub-signal monitoring line through a second via hole of the insulating protection layer, the first sub-signal monitoring line is formed on a same layer as the functional unit, and the second sub-signal monitoring line is formed on a same layer as the first signal transmission lines.

15. The display panel according to claim 11, wherein the signal shielding line comprises a first sub-signal shielding line and a second sub-signal shielding line, the second sub-signal shielding line is electrically connected to the first sub-signal shielding line through a third via hole of the insulating protection layer, the first sub-signal shielding line is formed on a same layer as the functional unit, and the second sub-signal shielding line is formed on a same layer as the first signal transmission lines.

16. The display panel according to claim 15, wherein in the display area, a length of the first sub-signal shielding line is the same as a length of the second sub-signal shielding line.

17. The display panel according to claim 15, wherein a number of the third via hole is at least one.

18. A display panel, comprising: a display area and a non-display area surrounding the display area, wherein the display panel further comprises:
a plurality of functional unit groups disposed in the display area and arranged at intervals along a first direction, wherein each of the functional unit groups comprises at least one functional unit arranged along a second direction;
a plurality of first signal transmission lines, wherein each of the first signal transmission lines is electrically connected to one of the functional units;
a signal shielding line correspondingly disposed on a gap between two adjacent functional unit groups and disposed between the first signal transmission lines of a same functional unit group and a functional unit of an adjacent functional unit group; and
an insulating protection layer, disposed between the functional unit and the first signal transmission lines, wherein each of the first signal transmission lines is electrically connected to a corresponding functional unit through a first via hole of the insulating protection layer;
wherein the functional unit comprises a plurality of touch electrode traces, the plurality of the touch electrode traces are surrounded to form a plurality of open areas, and the first signal transmission lines are arranged corresponding to the touch electrode traces.

19. A display panel, comprising: a display area and a non-display area surrounding the display area, wherein the display panel further comprises:
a plurality of functional unit groups disposed in the display area and arranged at intervals along a first direction, wherein each of the functional unit groups comprises at least one functional unit arranged along a second direction;
a plurality of first signal transmission lines, wherein each of the first signal transmission lines is electrically connected to one of the functional units;
a signal shielding line correspondingly disposed on a gap between two adjacent functional unit groups and disposed between the first signal transmission lines of a same functional unit group and a functional unit of an adjacent functional unit group; and
an insulating protection layer, disposed between the functional unit and the first signal transmission lines, wherein each of the first signal transmission lines is electrically connected to a corresponding functional unit through a first via hole of the insulating protection layer;
wherein the signal monitoring line is formed on a same layer as the first signal transmission lines or formed on a same layer as the functional unit.

* * * * *